United States Patent
Katoh et al.

(10) Patent No.: US 12,137,614 B2
(45) Date of Patent: Nov. 5, 2024

(54) PIEZOELECTRIC COMPOSITION, PIEZOELECTRIC ELEMENT, PIEZOELECTRIC DEVICE, PIEZOELECTRIC TRANSFORMER, ULTRASONIC MOTOR, ULTRASONIC WAVE-GENERATING ELEMENT, AND FILTER ELEMENT

(71) Applicant: TDK CORPORATION, Tokyo (JP)

(72) Inventors: Hiroki Katoh, Tokyo (JP); Yumi Akiyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 636 days.

(21) Appl. No.: 17/430,972

(22) PCT Filed: Feb. 10, 2020

(86) PCT No.: PCT/JP2020/005142
§ 371 (c)(1),
(2) Date: Aug. 13, 2021

(87) PCT Pub. No.: WO2020/166562
PCT Pub. Date: Aug. 20, 2020

(65) Prior Publication Data
US 2022/0140226 A1    May 5, 2022

(30) Foreign Application Priority Data
Feb. 14, 2019 (JP) .................. 2019-024494

(51) Int. Cl.
| | |
|---|---|
| *H10N 30/853* | (2023.01) |
| *C04B 35/495* | (2006.01) |
| *H02N 2/10* | (2006.01) |
| *H03H 9/56* | (2006.01) |
| *H10N 30/40* | (2023.01) |
| *H10N 30/50* | (2023.01) |

(52) U.S. Cl.
CPC ....... *H10N 30/8542* (2023.02); *C04B 35/495* (2013.01); *H02N 2/103* (2013.01); *H03H 9/562* (2013.01); *H10N 30/40* (2023.02); *H10N 30/50* (2023.02); *C04B 2235/3201* (2013.01); *C04B 2235/3239* (2013.01); *C04B 2235/3255* (2013.01); *C04B 2235/3281* (2013.01)

(58) Field of Classification Search
CPC .... H10N 30/8542; H10N 30/50; H10N 30/40; H02N 2/103; H03H 9/562; C04B 35/495; C04B 2235/3281; C04B 2235/3255; C04B 2235/3239; C04B 2235/3201
See application file for complete search history.

(56) References Cited

U.S. PATENT DOCUMENTS

| | | | |
|---|---|---|---|
| 6,387,295 B1 * | 5/2002 | Saito | H10N 30/097 264/491 |
| 11,005,028 B2 * | 5/2021 | Katoh | C04B 35/638 |
| 11,239,410 B2 * | 2/2022 | Katoh | C01G 33/00 |
| 2020/0243748 A1 | 7/2020 | Hirose et al. | |

FOREIGN PATENT DOCUMENTS

| | | | |
|---|---|---|---|
| DE | 112018001785 T5 | | 12/2019 |
| EP | 2431343 | * | 3/2012 |
| JP | 2007-204336 | * | 8/2007 |
| JP | 2010-215423 A | | 9/2010 |

* cited by examiner

*Primary Examiner* — C Melissa Koslow
(74) *Attorney, Agent, or Firm* — Oliff PLC

(57) ABSTRACT

A piezoelectric composition containing: at least one or more elements selected from alkali metal elements; at least one or more elements selected from a group consisting of vanadium, niobium, and tantalum; copper or copper and germanium; and oxygen. The piezoelectric composition has a main phase, and a high Cu-concentration phase in which a content ratio of copper is higher than the main phase, and when a content ratio of oxygen in the high Cu-concentration phase is set as $O_g$, and a content ratio of copper is set as $Cu_g$, $O_g$ and $Cu_g$ satisfy relationships of $51 \leq O_g \leq 60$ and $2.0 \leq Cu_g \leq 15$.

8 Claims, 3 Drawing Sheets

PIEZOELECTRIC COMPOSITION, PIEZOELECTRIC ELEMENT, PIEZOELECTRIC DEVICE, PIEZOELECTRIC TRANSFORMER, ULTRASONIC MOTOR, ULTRASONIC WAVE-GENERATING ELEMENT, AND FILTER ELEMENT

TECHNICAL FIELD

The present invention relates to a piezoelectric composition, a piezoelectric element including the piezoelectric composition, and a piezoelectric device (a piezoelectric transformer, an ultrasonic motor, an ultrasonic wave-generating element, a filter element, and the like) including the piezoelectric element.

BACKGROUND ART

A piezoelectric composition has an effect (piezoelectric effect) in which charges occur on a surface when receiving an external stress and an effect (converse piezoelectric effect) in which mechanical deformation occurs when an external electric field is applied on the basis of spontaneous polarization caused by a deviation of charges in a crystal.

A piezoelectric element to which the piezoelectric composition capable of mutually converting mechanical energy and electric energy is applied has been widely used in various fields. For example, since the piezoelectric composition has excellent responsiveness, it is possible to excite the piezoelectric composition itself or an elastic body joined to the piezoelectric composition by applying an AC electric field to cause resonance, and thus the piezoelectric composition is used as a piezoelectric transformer, an ultrasonic motor, and the like.

In addition, in an actuator as a piezoelectric element using the converse piezoelectric effect, minute displacement is obtained with accuracy in proportion to an applied voltage, and a response speed is high, and thus the actuator is used as a drive element for optical system components, a head drive element for HDDs, a head drive element for inkjet printers, a drive element for fuel injection valves, and the like. In addition, the actuator is also used as a sensor for reading a minute force or a minute amount of deformation by using the piezoelectric effect.

As the piezoelectric composition, a lead-based piezoelectric composition is widely used. However, the lead-based piezoelectric composition contains lead oxide (PbO) having a low melting point in an amount of approximately 60 to 70 wt %, and thus the lead oxide is likely to volatilize during firing. Therefore, from the viewpoint of environmental burdens, development of a lead-free piezoelectric composition becomes an especially important issue.

As the piezoelectric composition that does not contains lead and has high piezoelectric characteristics, an alkali metal niobate based compound is exemplified. For example, Patent Document 1 discloses a potassium niobate based piezoelectric material containing tungsten as an essential component.

On the other hand, a demand for a piezoelectric element mounted in a small-sized electronic device rapidly increases in accordance with rapid spread of IoT in recent years. It is necessary for the small-sized electronic device to operate with limited energy, and thus there is a demand for the piezoelectric element mounted in the small-sized electronic device to have high piezoelectric characteristics and to operate with low energy. In order for the piezoelectric element to operate with low energy, it is necessary to maximize output energy with respect to input energy. Accordingly, it is important to reduce energy consumed in the piezoelectric element. Specifically, it is necessary to suppress energy loss (self-heating) due to vibration of the piezoelectric element itself.

In addition, since a piezoelectric composition with a large energy loss may cause thermal runaway due to the self-heating to occur in operation, an operation near a resonance frequency is difficult. Accordingly, an applicable application is limited.

CITATION LIST

Patent Document

Patent Document 1: JP 2010-215423 A

SUMMARY OF THE INVENTION

Problem to be Solved by the Invention

In Patent Document 1, a large amount of displacement is obtained by raising a relative permittivity. However, when the relative permittivity of the piezoelectric composition becomes high, the self-heating tends to increase. That is, in the piezoelectric composition described in Patent Document 1, energy consumed by the piezoelectric composition itself with respect to an input voltage is still large. Accordingly, there is a problem that the piezoelectric element having the piezoelectric composition described in Patent Document 1 cannot operate with low energy.

The present invention has been made in consideration such circumstances, and an object thereof is to provide a piezoelectric composition in which self-heating is suppressed, a piezoelectric element including the piezoelectric composition, and a piezoelectric device including the piezoelectric element.

Means for Solving Problem

To accomplish the object, aspects of the present invention are as follows.

[1] A piezoelectric composition containing:
at least one or more elements selected from alkali metal elements;
at least one or more elements selected from the group consisting of vanadium, niobium, and tantalum;
copper or copper and germanium; and
oxygen,
in which the piezoelectric composition has a main phase, and a high Cu-concentration phase in which a content ratio of copper is higher than that in the main phase, and
$O_g$ and $Cu_g$ satisfy relationships of $51 \leq O_g \leq 60$ and $2.0 \leq Cu_g \leq 15$, in which a content ratio of oxygen in the high Cu-concentration phase is set as $O_g$, and a content ratio of copper in the high Cu-concentration phase is set as $Cu_g$.

[2] The piezoelectric composition according to [1],
in which a CV value of copper in the piezoelectric composition is 40 or more and 300 or less.

[3] The piezoelectric composition according to [1] or [2],
in which lithium, sodium, vanadium, and tantalum are substantially not contained.

[4] A piezoelectric element including:
the piezoelectric composition according to any one of [1] to [3]; and an electrode.

[5] A piezoelectric device including:
the piezoelectric element according to [4].
[6] A piezoelectric transformer including:
the piezoelectric element according to [4].
[7] An ultrasonic motor including:
a vibrating body including the piezoelectric element according to [4]; and
a moving body contacting the vibrating body.
[8] An ultrasonic wave-generating element including:
a vibrating body having a vibrating plate fixed to the piezoelectric element according to [4].
[9] A filter element including:
the piezoelectric element according to [4].

Effect of the Invention

According to the present invention, it is possible to provide a piezoelectric composition in which self-heating is suppressed, a piezoelectric element including the piezoelectric composition, and a piezoelectric device including the piezoelectric element.

MODE(S) FOR CARRYING OUT THE INVENTION

Figure 1:
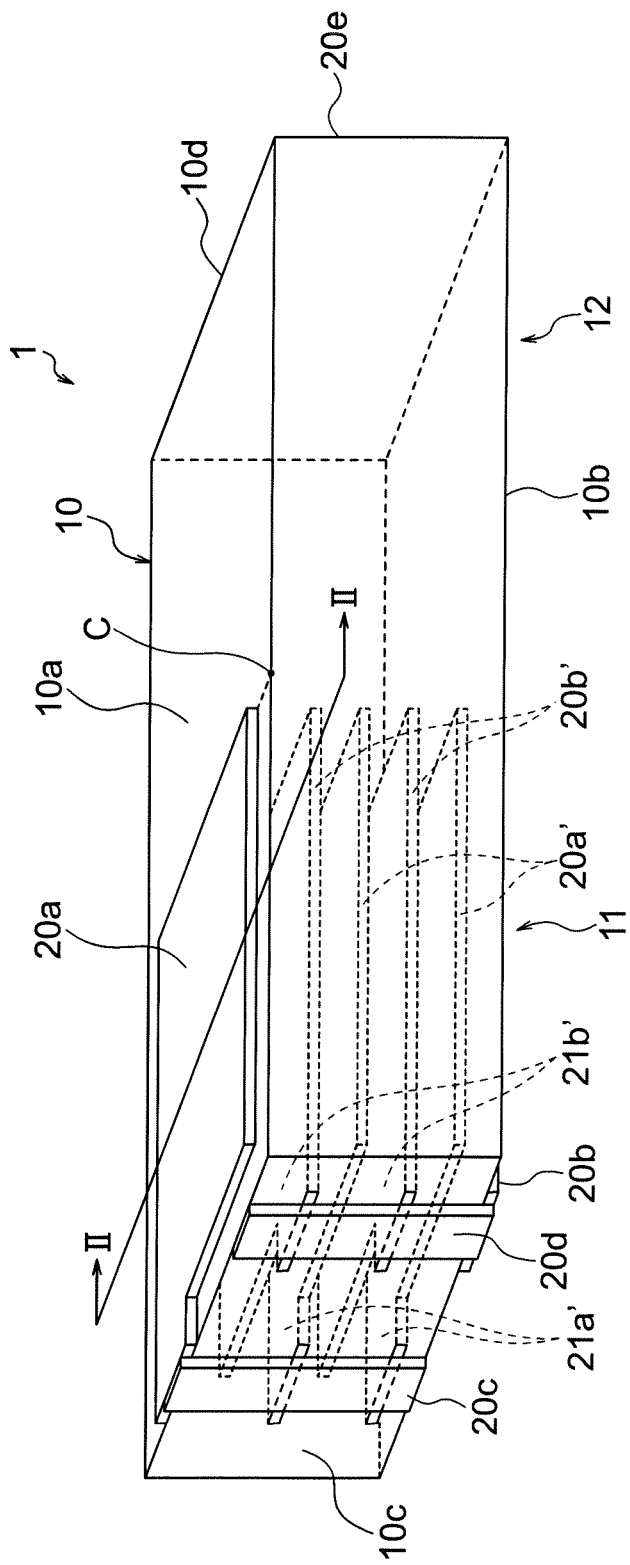
FIG. 1 is a schematic perspective view illustrating a piezoelectric transformer as an example of a piezoelectric element according to an embodiment.

Hereinafter, the present invention will be described in detail in the following order on the basis of a specific embodiment.
1. Piezoelectric Element
   1.1 Piezoelectric Transformer
   1.2 Piezoelectric Composition
      1.2.1 Main Phase
      1.2.2 High Cu-Concentration Phase
2. Method of Manufacturing Piezoelectric Element
3. Effect in This Embodiment
4. Modification Example 1. Piezoelectric Element A piezoelectric element according to this embodiment includes a piezoelectric composition according to this embodiment and an electrode. Details of the piezoelectric composition will be described later. Since the piezoelectric element according to this embodiment is suppressed from self-heating, the piezoelectric element is applicable to various piezoelectric devices. In the following description, description will be given of a piezoelectric transformer as a piezoelectric device to which the piezoelectric element according to this embodiment is applied.
(1.1 Piezoelectric Transformer)
The piezoelectric transformer is a transformer that transforms an input AC voltage by using a piezoelectric effect and outputs a transformed voltage. An example of the piezoelectric transformer is illustrated in FIG. 1. A piezoelectric transformer 1 illustrated in FIG. 1 includes an element body 10 having a rectangular parallelepiped shape in which a planar shape is a rectangle, and a pair of input electrodes 20a and 20b formed on a pair of opposite surfaces 10a and 10b which are main surfaces of the element body 10.

In this embodiment, the element body 10 is divided into a voltage input part 11 and a voltage output part 12 with the midpoint C of a longitudinal length set as a boundary. The voltage input part 11 and the voltage output part 12 are integrated with each other.

Figure 2:
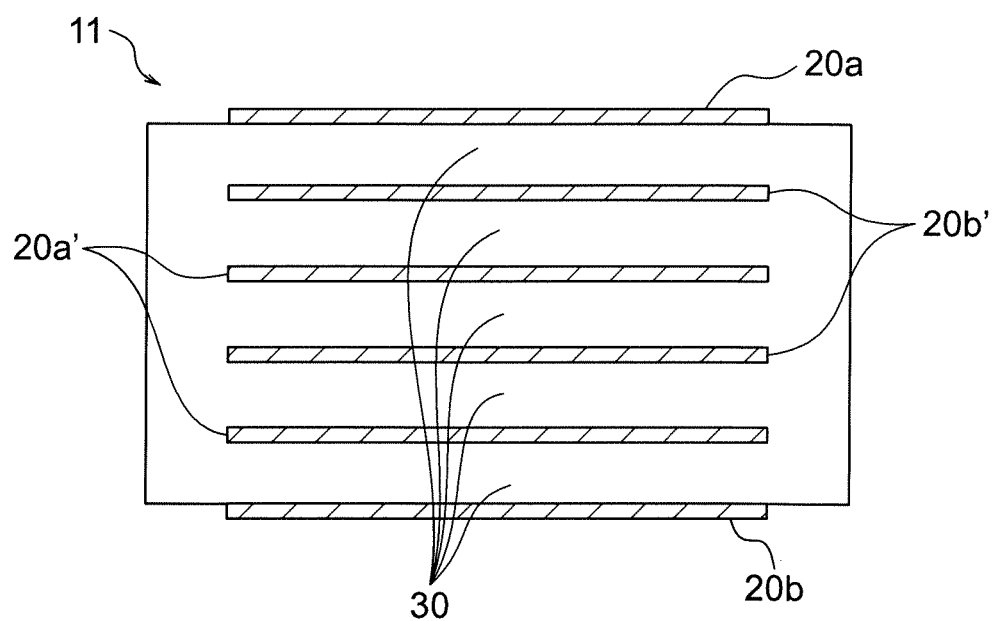
FIG. 2 is a schematic cross-sectional view of the piezoelectric transformer along line II-II illustrated in FIG. 1.

As illustrated in FIG. 2, the voltage input part 11 is a stacked body in which a piezoelectric layer 30 constituted by the piezoelectric composition according to this embodiment, and internal electrodes 20a' and 20b' are alternately stacked. That is, the piezoelectric transformer 1 is a stacked type piezoelectric transformer. In addition, the thickness (interlayer thickness) per one layer of the piezoelectric layers 30 may be arbitrarily set in correspondence with desired characteristics, applications, and the like. In this embodiment, an interlayer thickness is preferably 50 to 140 μm.

The internal electrodes 20a' and 20b' have the same shape as the input electrodes 20a and 20b, respectively. When viewed from a stacking direction, the input electrode 20a and the internal electrode 20a' are disposed to overlap each other, and the input electrode 20b and the internal electrode 20b' are disposed to overlap each other. In addition, the internal electrode 20a' and the internal electrode 20b' are alternately stacked.

As illustrated in FIG. 1, the internal electrode 20a' is led out to an end surface 10c of the element body 10 through a lead-out portion 21a', and is exposed onto the end surface 10c. The internal electrode 20b' is led out to an end surface 10c of the element body 10 through a lead-out portion 21b', and is exposed onto the end surface 10c.

The input electrode 20a and the lead-out portion 21a' are electrically connected to each other by a connection electrode 20c, and the input electrode 20b and the lead-out portion 21b' are electrically connected to each other by a connection electrode 20d. That is, the input electrode 20a and the internal electrode 20a' are electrically connected to each other, and the input electrode 20b and the internal electrode 20b' are electrically connected to each other.

In this embodiment, the connection electrode 20c and the connection electrode 20d are disposed along a lateral direction of the element body 10 in line symmetry with respect to a straight line passing through the midpoint of a lateral length.

The configuration of the voltage input part 11 is not limited to the configuration illustrated in FIG. 1, and the input electrode 20a and the internal electrode 20a' may be electrically connected to each other and the input electrode 20b and the internal electrode 20b' may be electrically connected to each other so that the input electrode 20a and the input electrode 20b are not short-circuited.

The voltage output part 12 is constituted by the piezoelectric composition according to this embodiment. In addition, an electrode is not formed on a main surface and at the inside of the voltage output part 12. In this embodiment, in the voltage output part 12, an output electrode 20e is formed on a surface opposite to the end surface 10c of the element body 10, that is, an end surface 10d of the element body 10.

A conductive material contained in the electrodes 20a to 20e can be arbitrarily selected in correspondence with desired characteristics, applications, and the like. In this embodiment, gold (Au), silver (Ag), palladium (Pd), and the like exemplified.

The element body 10 has the rectangular parallelepiped shape in FIG. 1, but the shape of the element body 10 can be arbitrarily set in correspondence with desired characteristics, applications, and the like. In addition, dimensions of the element body 10 can be arbitrarily set in correspondence with desired characteristics, applications, and the like.

In the element body 10, the voltage input part 11 is polarized in a thickness direction of the voltage input part 11, and the voltage output part 12 is polarized in a longitudinal direction of the element body 10.

When an AC voltage is applied to the input electrodes 20a and 20b at a predetermined frequency, first, in the voltage input part 11, electric energy is converted into mechanical energy due to the converse piezoelectric effect, and the voltage input part 11 vibrates. The voltage output part 12 integrated with the voltage input part 11 is excited due to vibration of the voltage input part 11, and thus the voltage output part 12 also vibrates. As a result, in the voltage output part 12, mechanical energy is converted into electric energy due to the piezoelectric effect, and the converted electric energy is output from the output electrode 20e.

In this embodiment, since the voltage input part 11 has a configuration in which the piezoelectric composition is stacked, electrostatic capacitance between input electrodes increases. Accordingly, a boosting ratio that is a ratio of an output voltage to an input voltage increases.

(1.2 Piezoelectric Composition)

The piezoelectric composition according to this embodiment contains at least one or more elements selected from alkali metal elements; at least one or more elements selected from the group consisting of vanadium (V), niobium (Nb), and tantalum (Ta); copper (Cu) or copper and germanium (Ge); and oxygen (O). In this embodiment, the above-described metal elements may be contained in the piezoelectric composition mainly as a complex oxide or an oxide. In addition, the sum of content ratios of the above-described elements is 99 at % or greater in 100 at % of piezoelectric composition.

In this embodiment, as the alkali metal elements, lithium (Li), sodium (Na), and potassium (K) are preferable.

In addition, the piezoelectric composition has a main phase, and a high Cu-concentration phase as a crystal phase.

(1.2.1 Main Phase)

The main phase is constituted by a complex oxide having a perovskite structure. The complex oxide having the perovskite structure is typically expressed by a general formula $ABO_3$.

In the perovskite structure, an element having a large ionic radius, for example, an alkali metal element or an alkali-earth metal element tends to occupy an A site of $ABO_3$, and an element having a small ionic radius, for example, a transition metal element tends to occupy a B site of $ABO_3$. In addition, a $BO_6$ oxygen octahedron constituted by a B-site element and oxygen constitutes a three-dimensional network sharing a vertex of each other, and an interstitial site of the network is occupied by an A-site element, thereby forming the perovskite structure.

In this embodiment, mainly, the A-site element is an alkali metal element, and the B-site element is at least one or more elements selected from the group consisting of vanadium, niobium, and tantalum. Mainly, the main phase is constituted by the above-described elements, but copper or copper and germanium may be solid-soluted in the main phase.

(1.2.2 High Cu-Concentration Phase)

The high Cu-concentration phase is a phase in which a content ratio of copper is higher than that in the main phase. In this embodiment, when a content ratio of oxygen in 100 at % of high Cu-concentration phase is set as $O_g$ at %, $O_g$ satisfies a relationship of $51 \leq O_g \leq 60$. In addition, when a content ratio of copper in 100 at % of high Cu-concentration phase is set as $Cu_g$ at %, $Cu_g$ satisfies a relationship of $2.0 \leq Cu_g \leq 15$. Note that, the content ratio of copper in 100 at % of main phase is typically less than 2.0 at %.

When copper is contained in the above piezoelectric composition, mechanical strength and piezoelectric characteristics of the piezoelectric composition are improved. However, in a case where copper is contained in a phase different from the main phase, the copper-containing phase vibrates in combination with the main phase due to the piezoelectric effect and the converse piezoelectric effect. At this time, when a phase of an intrinsic vibration of the copper-containing phase and a phase of an intrinsic vibration of the main phase greatly out of phase, the intrinsic vibrations of the copper-containing phase and the main phase weaken each other. At this time, elastic energy stored inside a piezoelectric material is consumed to weaken the intrinsic vibrations, and heat is generated. As a result, whenever vibrations propagate through the piezoelectric composition, heat is generated, and a temperature of the piezoelectric element including the piezoelectric composition rises. That is, efficiency of the piezoelectric element deteriorates, and self-heating increases.

In order to suppress this kind of phase shift, in this embodiment the high Cu-concentration phase has a perovskite structure or a structure similar to the perovskite structure.

As described above, the main phase has the perovskite structure. Accordingly, when the structure of the high Cu-concentration phase is set as the perovskite structure or the structure similar to the perovskite structure, the phase shift between the intrinsic vibration of the main phase and the intrinsic vibration of the high Cu-concentration phase can be reduced when the voltage is applied. As a result, heat generation of the piezoelectric element including the piezoelectric composition can be reduced.

Whether or not the high Cu-concentration phase has the perovskite structure or the structure similar to the perovskite structure is determined from a content ratio of oxygen in the above-described high Cu-concentration phase.

A complex oxide having the perovskite structure is expressed by a general formula $ABO_3$. $ABO_3$ is constituted by five atoms, and three oxygen atoms exist in $ABO_3$, and thus a content ratio of oxygen contained in $ABO_3$ is 60 at %. Accordingly, the further the content ratio of oxygen in the high Cu-concentration phase is close to 60 at %, the further the high Cu-concentration phase has the perovskite structure or the structure similar to the perovskite structure. On the other hand, when the content ratio of oxygen in the high Cu-concentration phase is greatly less than 60 at %, the high Cu-concentration phase is likely to transition to a structure different from the perovskite structure. For example, in a case where the content ratio of oxygen in the high Cu-concentration phase is 50 at %, the high Cu-concentration phase is likely to have the same structure as a structure of CuO or a structure similar to the structure. In addition, for example, in a case where the content ratio of oxygen in the high Cu-concentration phase is 33 at %, the high Cu-concentration phase is likely to have the same structure as a structure of $Cu_2O$ or a structure similar to the structure.

As described above, in a case where the high Cu-concentration phase has a structure different from the perovskite structure, a temperature of the piezoelectric element including the piezoelectric composition rises. Therefore, in this embodiment, a range of the content ratio of oxygen in the high Cu-concentration phase is set to the above-described range.

As described above, the upper limit value of $O_g$ is theoretically 60 at %, but a value higher than 60 at %, for example, 61 at % is also included in the upper limit value of $O_g$ in consideration of a measurement error.

In addition, $Cu_g$ is preferably 4 or greater. In addition, $Cu_g$ is preferably 9 or less.

In a case where the content ratio of copper in the high Cu-concentration phase is excessively small, improvement of the mechanical strength and the piezoelectric characteristic of the piezoelectric composition tends to be insufficient. In a case where the content ratio of copper in the high Cu-concentration phase is excessively large, there is a tendency that the high Cu-concentration phase is likely to transition to a structure different from the perovskite structure.

A method of measuring the content ratio of oxygen and the content ratio of copper in the high Cu-concentration phase may be a method capable of quantifying a concentration distribution of an element contained in the piezoelectric composition. In this embodiment, in electron probe micro analyzer (EPMA) analysis, with respect to a cut-out surface obtained by cutting out the piezoelectric composition after firing, surface analysis on a specific region is performed by using an EPMA device, and information of the content (concentration) of each element at a measurement point within the region is obtained.

From the obtained information of the concentration of each element, the main phase and the high Cu-concentration phase are identified, and the content ratio of oxygen and the content ratio of copper may be calculated when a total content ratio of elements contained in a region corresponding to the high Cu-concentration phase is set as 100 at %.

In addition, it is preferable that the high Cu-concentration phase exists in the piezoelectric composition with a predetermined variation. When the high Cu-concentration phase exists with a predetermined variation, heat generation of the piezoelectric composition can be further suppressed in comparison to local existence.

In this embodiment, the predetermined variation of the high Cu-concentration phase can be expressed by a CV value of a copper concentration in the piezoelectric composition. The CV value of the copper concentration is calculated by the following Expression on the basis of a standard deviation $\sigma$ of the copper concentration and an average value Av of the copper concentration in the piezoelectric composition.

$$CV \text{ value } (\%) = 100 \times (\sigma/Av)$$

In this embodiment, the CV value of the copper concentration is preferably 40 to 300. In addition, the CV value is preferably 55 or greater. On the other hand, the CV value is preferably 85 or less.

As a method of calculating the CV value of the copper concentration, a method capable of measuring a concentration distribution of copper in the piezoelectric composition may be employed. In this embodiment, the CV value can be calculated as follows through the electron probe micro analyzer (EPMA) analysis. First, with respect to a cut-out surface obtained by cutting out the piezoelectric composition after firing, a surface analysis on a specific region is performed by using an EPMA device to obtain information on the content (concentration) of copper at a measurement point within the region.

The CV value can be calculated by calculating a standard deviation $\sigma$ of the copper concentration and an average value Av of the copper concentration in respective measurement points within the region from the obtained information on the copper concentration. In this embodiment, a magnification at which the surface analysis is performed is preferably 250 to 2000 times, and it is preferable to perform the surface analysis in three or more fields of view at such a magnification.

In addition, the piezoelectric composition according to this embodiment preferably contains germanium. By containing germanium, deliquescence of the piezoelectric composition is suppressed, and thus the piezoelectric composition according to this embodiment can exhibit high reliability even under a high-temperature and high-humidity environment. Germanium may be contained in the main phase, may be contained in the high Cu-concentration phase, or may be contained in a region different from the main phase and the high Cu-concentration phase. In this embodiment, germanium is preferably contained in the phase or region other than the main phase.

As described above, one of the causes of the self-heating of the piezoelectric element including the piezoelectric composition according to this embodiment is vibration heat caused by a phase shift between the phase of the intrinsic vibration of the main phase and the phase of the intrinsic vibration of the high Cu-concentration phase. The greater the amount of displacement of the piezoelectric composition is, the further vibration heat increases.

On the other hand, the greater the electrostatic capacitance of the piezoelectric composition is, the further the amount of displacement of the piezoelectric composition increases. Therefore, it is also effective to reduce the electrostatic capacitance of the piezoelectric composition to suppress vibration heat. In the piezoelectric composition according to this embodiment, lithium and sodium tend to increase the electrostatic capacitance of the piezoelectric composition in comparison to potassium. In addition, vanadium and tantalum tend to increase the electrostatic capacitance of the piezoelectric composition in comparison to niobium. Thus, from the viewpoint of suppressing heat generation of the piezoelectric element, it is preferable that the piezoelectric composition according to this embodiment contains potassium, niobium, copper or copper and germanium, and oxygen, and substantially does not contain lithium, sodium, vanadium, and tantalum.

Note that, "substantially does not contain" means that a total content ratio of lithium, sodium, vanadium, and tantalum is 0.1 at % or less in 100 at % of piezoelectric composition.

The piezoelectric composition according to this embodiment may contain other components in addition to the above-described components. For example, the piezoelectric composition may contain at least one of transition metal elements (elements of Group 3 to Group 11 in a modern periodic table) except for vanadium, niobium, tantalum, and copper described above, alkali-earth metal elements, elements of Group 12 in the modern periodic table, and metal elements of Group 13 in the modern periodic table.

Specifically, examples of the transition metal elements other than rare-earth elements include chromium (Cr), manganese (Mn), iron (Fe), cobalt (Co), nickel (Ni), tungsten (W), and molybdenum (Mo). In addition, examples of the rare-earth elements include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

Examples of the alkali-earth metal elements include magnesium (Mg) and strontium (Sr). Examples of the elements of Group 12 include zinc (Zn). Examples of the metal elements of Group 13 include aluminum (Al), gallium (Ga), and indium (In).

The content ratio of these components is preferably 0.1 at % or less in 100 at % of piezoelectric composition.

Note that, the piezoelectric composition according to this embodiment may contain lead (Pb) as an impurity, but the content ratio thereof is preferably 1 mass % or less, and the content ratio of Pb is more preferably equal to or less than a measurement limit. This is because, from the viewpoints of low pollution, environmental friendliness, and an ecological aspect, it is possible to minimize volatilization of Pb during firing, or release of Pb into the environment after an electronic device equipped with a piezoelectric element including the piezoelectric composition according to this embodiment is distributed on the market and is discarded.

An average grain size of a crystal phase constituting the piezoelectric composition according to this embodiment may be controlled from the viewpoint of piezoelectric characteristics. In this embodiment, for example, the average grain size is preferably 0.5 to 20 μm.

2. Method of Manufacturing Piezoelectric Element

Next, an example of a method of manufacturing the piezoelectric element will be described below.

First, starting materials of the piezoelectric composition are prepared. In this embodiment, as the starting materials of a complex oxide constituting the main phase, a compound containing an alkali metal element, and a compound containing at least one element selected from vanadium, niobium, and tantalum (hereinafter, referred to as compound containing niobium or the like) can be used. Examples of the compound containing the alkali metal element include carbonate and a hydrogen carbonate compound. Examples of the compound containing niobium or the like include an oxide.

A starting material of copper may be copper itself, or a compound containing copper. In this embodiment, an oxide containing copper is preferable. In addition, a starting material of germanium may be germanium itself or a compound containing germanium as with copper. In this embodiment, an oxide containing germanium is preferable.

The prepared starting materials of the complex oxides are weighed in predetermined ratios, and then mixed for 5 to 20 hours. A mixing method may be wet mixing or a dry mixing. In the case of the wet mixing, a mixed powder is dried. Examples of a solvent in the wet mixing include water, alcohol such as ethanol, or a mixture of water and alcohol. In this embodiment, it is preferable to dry the starting materials by spray drying after wet mixing.

The mixed powder after drying is calcined to obtain a calcined powder. In this embodiment, it is preferable to obtain a calcined powder including not only the complex oxide formed by calcination but also a localized unstable phase. Then, the starting material of copper or copper and germanium is added to the calcined powder, the resultant mixture is molded into a predetermined shape, and the resultant green compact is fired. As a result, in a sintered body (piezoelectric composition) after firing, a high Cu-concentration phase having a perovskite structure or a structure similar to the perovskite structure is easily generated. Accordingly, as described above, the self-heating of the piezoelectric composition can be suppressed.

The unstable phase is a phase to be a complex oxide having the perovskite structure, but the unstable phase corresponds to a localized region in which a solid-state reaction between a compound containing an alkali metal element and a compound containing niobium or the like does not progress sufficiently or uniformly in the mixed powder at the time of calcination. Accordingly, the unstable phase is a phase that has a composition close to the complex oxide but is different from the complex oxide, and is a relatively reactive phase. The form of the unstable phase may be any one of a solid, a liquid, a liquid crystal, and a solid solidified from a liquid. In addition, arrangement of atoms constituting the unstable phase need not necessarily form a long-range order.

Since the unstable phase is included in the powder after calcination (calcined powder), a starting material of a predetermined element (for example, copper or copper and germanium) enhancing the piezoelectric characteristics is added to the calcined powder, and the green compact, which is obtained by molding the resultant mixture into a predetermined shape, is fired, so that the unstable phase and the additive added to the calcined powder selectively react, and thus a reaction of forming a complex oxide having the perovskite structure progresses. As a result, a phase which has the perovskite structure or a structure similar to the perovskite structure and in which a relatively large amount of additives are solid-soluted in the structure is formed. In this embodiment, since the starting material containing at least copper is added to the calcined powder, the high Cu-concentration phase is formed.

Examples of a method of forming the unstable phase include a method of granulating a mixture including a compound containing an alkali metal element and a compound containing niobium or the like by spray drying, and a method of controlling a distance between the compound containing the alkali metal element and the compound containing niobium or the like in a mixed powder so that a reaction between the compound containing the alkali metal element and the compound containing niobium or the like is less likely to progress.

Typically, the purpose of calcining the mixed powder of the starting materials of the complex oxide constituting the main phase is to uniformly form the complex oxide. That is, calcination promotes a formation of the complex oxide having the perovskite structure by sufficiently progressing a solid-state reaction between the compound containing the alkali metal element and the compound containing niobium or the like. In addition, compression of the mixed powder forces a distance between the compound containing the alkali metal element and the compound containing niobium or the like to shorten, and thus providing an environment in which these compounds are more likely to react with each other.

Therefore, in this embodiment, calcination is performed by using a method opposite to the typical method of uniformly forming the complex oxide, and thus the calcined powder including the unstable phase is obtained.

Note that, in a case where the unstable phase is not formed in the calcined powder, a compound that becomes a high Cu-concentration phase may be added to the calcined powder, or a compound that is dissolved during firing and easily react with the additives added to the calcined powder may be added to the calcined powder.

In this embodiment, with regard to calcination conditions, it is preferable that in the atmosphere a calcination temperature is set to 750° C. to 1050° C. and a calcination time is set to 1 to 20 hours.

In a case where the obtained calcined powder is aggregated, it is preferable to perform pulverization of the calcined powder for a predetermined time by using a ball mill or the like to obtain a pulverized powder. A starting material of copper and a starting material of germanium which are weighed in a predetermined ratio are added to the calcined powder or the pulverized powder, and mixing is performed by using a ball mill or the like for 5 to 20 hours to obtain a mixed powder of the piezoelectric composition. A mixing method may be wet mixing method or dry mixing. In the case of the wet mixing, the mixed powder is dried to obtain a mixed powder of the piezoelectric composition.

As a method of manufacturing the piezoelectric element illustrated in FIG. 1, that is, the piezoelectric transformer 1, a known method may be used. For example, a green chip that will be the element body 10 illustrated in FIG. 1 is prepared, and the green chip is fired to obtain the element body 10. Then, an input electrode, an output electrode, and a connection electrode are printed or transferred to the element body 10 and are baked, thereby manufacturing the piezoelectric transformer 1.

Examples of a method of manufacturing the green chip include a typical print method and a sheet method using paste. In the print method and the sheet method, a green sheet is formed by using paste for a green sheet obtained by mixing the starting material powder of the above-described piezoelectric composition, and a vehicle in which a binder is dissolved in a solvent to form paint.

Subsequently, paste for an electrode obtained by mixing a conductive material, and a vehicle in which a binder is dissolved in a solvent to form paint is printed on the green sheet by using a printing mask in which a pattern corresponding to the internal electrode 20a' is formed. Similarly, the paste for an electrode is printed on the green sheet by using a printing mask in which a pattern corresponding to the internal electrode 20b' is formed.

The green sheets are alternately stacked, the stacked green sheets are sandwiched between green sheets on which the paste for an electrode is not printed, and heat pressing is performed to form a green sheet stacked body. In this embodiment, it is preferable that the heat pressing is performed at a pressure of 30 to 300 MPa for 3 to 15 minutes while heating to 20° C. to 100° C. The obtained green sheet stacked body is cut out to obtain an individual green chip.

The obtained green chip is subjected to a binder removal treatment. As binder removal treatment conditions, a holding temperature is preferably set to 400° C. to 800° C., and a temperature holding time is preferably set to 2 to 8 hours.

Subsequently, the green chip after the binder removal treatment is fired. As firing conditions, a holding temperature is preferably set to 950° C. to 1060° C., a temperature holding time is preferably set to 2 to 4 hours, a temperature rising and a temperature lowering rates are preferably set to approximately 50° C./hour to 300° C./hour, and an atmosphere is preferably set to an oxygen-containing atmosphere.

An element body as an obtained sintered body is polished as necessary, and the paste for an electrode is applied and baked to form the input electrode, the output electrode, and the connection electrode. A method of forming the electrodes is not particularly limited, and the electrodes may be formed, for example, by deposition, and sputtering.

The element body on which the electrodes are formed is subjected to a poling processing by applying an electric field of 2 to 5 kV/mm in oil at a predetermined temperature for approximately five minutes to one hour. For the voltage input part, the poling processing is performed in a stacking direction of the internal electrode, and for the voltage output part, the poling processing is performed in a longitudinal direction of the element body. After the poling processing, the piezoelectric transformer in which spontaneous polarization is aligned in the stacking direction of the internal electrode in the voltage input part and spontaneous polarization is aligned in the longitudinal direction of the element body in the voltage output part is obtained.

3. Effect in This Embodiment

Typically, in the case of manufacturing a niobate-based piezoelectric composition, a solid-state reaction between oxides is promoted by a heat treatment to form a complex oxide as a main phase. Therefore, in order to accelerate the solid-state reaction, for example, an operation of increasing dispersibility of a mixed powder of the oxides, and an operation of compressing the mixed powder are performed before the heat treatment. As a result, the solid-state reaction progresses sufficiently, and a uniform complex oxide is obtained after the heat treatment, and thus phases other than the main phase are hardly generated.

However, in a case where the additive enhancing the piezoelectric characteristics is added to the obtained complex oxide, and then the heat treatment is performed, the complex oxide is stable, and thus the additive is hardly solid-soluted in the main phase. As a result, the piezoelectric composition in which the additive is included as a phase maintaining a structure different from the main phase is obtained.

As described above, in this piezoelectric composition, since the structure of the main phase and the structure of the additive phase are different from each other, a vibration loss increases and thus heat generation is likely to occur.

Therefore, in this embodiment, first, a solid-state reaction of forming the complex oxide is controlled so as to locally generate a phase in which formation of the complex oxide is insufficient. Then, the phase and the additive are caused to react with each other when the main phase is formed by sufficiently progressing a reaction of the phase. Thereby, the phase is transitioned to a phase having the structure of the main phase or a structure similar to the structure of the main phase while taking in the additive.

As a result, although the obtained piezoelectric composition includes the main phase and a phase in which a content ratio of the additive is higher than that in the main phase, the structure of the phase in which the content ratio of the additive is higher than that in the main phase is the same as or similar to the structure of the main phase, and thus self-heating of the piezoelectric composition can be suppressed.

In addition, in the piezoelectric composition, since the phase in which the content ratio of the additive is higher than that in the main phase exists with a predetermined variation, self-heating can be suppressed in the piezoelectric composition as a whole.

In addition, the vibration loss of the piezoelectric composition is proportional to the amount of displacement of the piezoelectric composition. On the other hand, the amount of displacement of the piezoelectric composition is proportional to electrostatic capacitance of the piezoelectric composition. Therefore, to reduce the electrostatic capacitance of the piezoelectric composition, it is preferable to limit elemental species contained in the piezoelectric composition to the above-described elements.

Although the amount of displacement of the piezoelectric composition is an important piezoelectric characteristic, when vibration heat associated with the displacement of the piezoelectric composition increases, the element itself generates heat. Particularly, in the case of a piezoelectric device that is continuously driven in the vicinity of a resonance frequency, when a heat generation rate in the element exceeds a heat dissipation rate, intermittent heat storage occurs in the element itself during operation, causing thermal runaway of the piezoelectric element. This piezoelectric element has low reliability, and cannot be applied to the piezoelectric device even through the amount of displacement is large.

Therefore, as the piezoelectric composition applied to the piezoelectric device, a highly efficient piezoelectric composition having small vibration heat, such as the piezoelectric composition according to this embodiment, is preferable.

4. Modification Example

In the above-described embodiment, as the piezoelectric device to which the piezoelectric element is applied, the piezoelectric transformer is described, but it may be a piezoelectric device other than the piezoelectric transformer. Examples thereof include an ultrasonic motor, a vibrating device, an acoustic device, an ultrasonic wave-generating element, and a filter element.

The ultrasonic motor includes a vibrating body including the above-described piezoelectric element, and a moving body that comes into contact with the vibrating body. This ultrasonic motor can be used, for example, as a drive unit provided in an optical device such as an imaging device.

The vibrating device includes a vibrating body in which the above-described piezoelectric element is fixed to a vibrating plate. In addition, a dust removing device includes the above-described vibrating device as a vibrating unit.

The acoustic device includes a vibrating body in which the above-described piezoelectric element is fixed to a vibrating plate.

The ultrasonic wave-generating element includes a vibrating body in which the above-described piezoelectric element is fixed to a vibrating plate.

The filter element includes the above-described piezoelectric element.

Hereinbefore, description has been given of the embodiment of the present invention, but the present invention is not limited to the above-described embodiment at all, and can be modified in various aspects within the scope of the present invention.

EXAMPLES

Hereinafter, the present invention will be described in more detail with reference to examples and comparative examples. However, the present invention is not limited to the following examples.

First, as starting materials of the piezoelectric composition, powders of lithium carbonate ($Li_2CO_3$), sodium hydrogen carbonate ($NaHCO_3$), potassium hydrogen carbonate ($KHCO_3$), vanadium oxide ($V_2O_5$), niobium oxide ($Nb_2O_5$), tantalum oxide ($Ta_2O_5$), copper oxide (CuO), and germanium oxide ($GeO_2$) were prepared.

The prepared starting materials were weighed so that in a piezoelectric composition (sintered body) after firing, a complex oxide constituting the main phase would have the perovskite structure, and contain mainly at least one selected from Li, Na, and K as an A-site element, and at least one selected from V, Nb, and Ta as a B-site element.

The weighed powders of $Li_2CO_3$, $NaHCO_3$, $KHCO_3$, $V_2O_5$, $Nb_2O_5$, and $Ta_2O_5$ were mixed with water by a ball mill for 16 hours, and the resultant mixture was dried by using a spray drier to obtain a mixed powder. The obtained mixed powder was not press-molded, and was calcined under conditions of 1000° C. and four hours in a powder state to obtain a calcined powder of the complex oxide.

Subsequently, the calcined powder was pulverized by a ball mill for 16 hours to obtain a pulverized powder.

Weighed powders of CuO and $GeO_2$ were added to the obtained pulverized powder, and the resultant mixture was mixed by a ball mill for 16 hours and was dried at 120° C. to obtain a starting material powder of the piezoelectric composition.

The obtained starting material powder of the piezoelectric composition, and a vehicle obtained by mixing acrylic binder with a solid content of 8 mass % of and 0.5 mass % of dispersant were mixed to form paint, thereby obtaining paste for a green sheet. A green sheet of the piezoelectric composition was formed by using the obtained paste for a green sheet.

Paste (Ag/Pd=70/30) for an Ag—Pd electrode was printed on the formed green sheet by using a printing mask with a pattern corresponding to a shape of the internal electrode to form an internal electrode pattern, and then dried.

The obtained green sheet was alternately stacked, and the stacked green sheets were sandwiched between green sheets on which the internal electrode pattern was not formed, and heat pressing was performed at 35 MPa for 5 minutes while heating to 100° C., thereby obtaining a green sheet stacked body.

The green sheet stacked body was cut out in a predetermined size by a dicing saw to obtain a green chip. The obtained green chip was subjected to a binder removal treatment at 550° C. for two hours. The green chip after the binder removal treatment was fired in the atmosphere at 1050° C. for two hours to obtain a sintered body (element body). The obtained element body has dimensions of a length of 32 mm, a width of 6 mm, and a thickness of 1.8 mm.

The obtained element body was polished, and silver paste was printed, and baking was performed at 800° C. to form an input electrode, an output electrode, and a connection electrode. For the voltage input part, an electric field of 3 kV/mm was applied between input electrodes in silicone oil at 150° C. for five minutes to perform a poling processing. Subsequently, for the voltage output part, an electric field of 3 kV/mm was applied between the input electrode and the output electrode in silicone oil at 50° C. for five minutes to perform a poling processing, thereby obtaining samples of a stacked piezoelectric element (Examples 1 to 12, and Comparative Examples 1 to 3).

Each of the obtained samples was cut out along a stacking direction, and surface analysis was performed with respect to the cut-out surface of the piezoelectric composition. First, element mapping was performed with respect to 51.2 μm×51.2 μm fields of view of by using an EPMA device (JXA-8500, manufactured by JEOL Ltd.) to identify the main phase and the high Cu-concentration phase.

Subsequently, a content ratio of oxygen and a content ratio of copper when a total content ratio of elements contained in a region corresponding to the high Cu-concentration phase was set as 100 at % were calculated. Results are shown in Table 1.

Next, from detection intensity of copper per pixel in a mapping image, a standard deviation σ and an average value Av of the detection intensity of copper in the mapping image were calculated, and a CV value was calculated from the following Expression.

$$CV \text{ value (\%)}=100(\sigma/Av)$$

Self-heating of the piezoelectric element was evaluated as follows. A driving driver was connected to the voltage input part of the obtained sample, and a load resistor of 50Ω was connected to the voltage output part. While maintaining a driving frequency of the piezoelectric element at a resonance frequency, after performing resonance driving for 1 minute while adjusting a practical output to 2 W, a temperature of the voltage input part was measured from directly above the piezoelectric element by using an infrared thermometer (infrared C2 thermography camera manufactured by FLIR system). A temperature rise of the piezoelectric element due to driving was calculated from the temperature of the voltage input part after driving the piezoelectric element and the temperature of the voltage input part before driving the piezoelectric element. Results are shown in Table 1.

Figure 3:
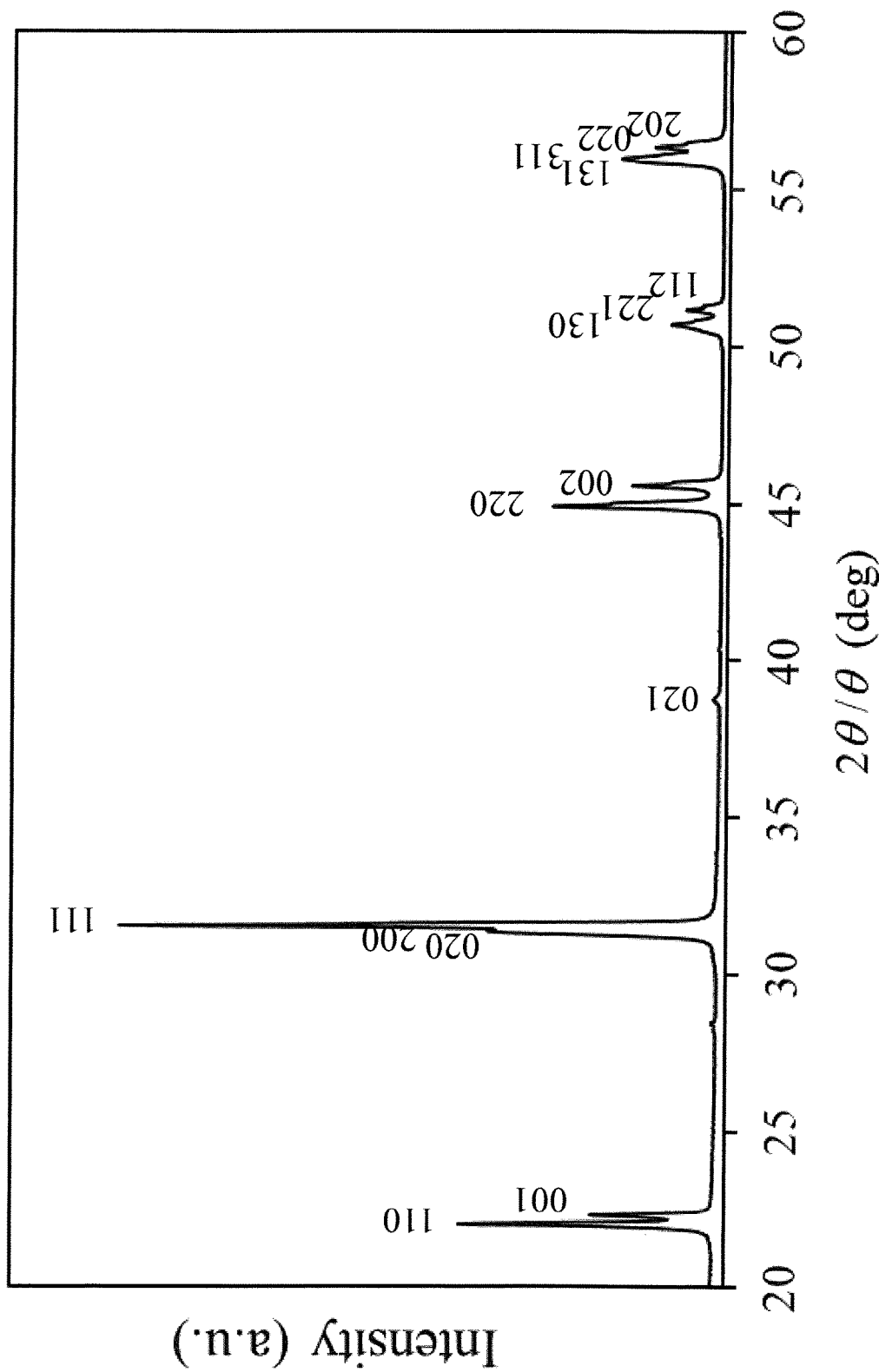
FIG. 3 is an X-ray diffraction chart of a sample according to an example of the present invention.

In addition, X-ray diffraction (XRD) measurement was performed on the sample of Example 5. In the XRD measurement, X-ray diffraction device (SmartLab manufactured by Rigaku Corporation) using a Cu-Kα ray as an X-ray source was used. X-ray diffraction charts obtained by the measurement are shown in FIG. 3.

[Table 1]

That is, it was confirmed that the main phase and the high Cu-concentration phase have the perovskite structure.

INDUSTRIAL APPLICABILITY

In the piezoelectric composition according to the present invention, self-heating is suppressed even when energy is input, and thus the piezoelectric composition is appropriately applicable to all piezoelectric devices using the piezoelectric element.

EXPLANATIONS OF LETTERS OR NUMERALS

1 PIEZOELECTRIC TRANSFORMER
10 ELEMENT BODY
11 VOLTAGE INPUT PART
20a, 20b INPUT ELECTRODE
20a', 20b' INTERNAL ELECTRODE
20c, 20d CONNECTION ELECTRODE

TABLE 1

| | | Crystal phase | | | | | | | | | | Voltage input part |
|---|---|---|---|---|---|---|---|---|---|---|---|---|
| | | Composition in crystal phase (at %) | | | | | | | | | | temperature rise |
| | Kind | Li | Na | K | V | Nb | Ta | Cu | Ge | O | CV of Cu | ΔT (° C.) |
| Example 1 | Main phase | — | — | 23.5 | — | 18.2 | — | 0.6 | — | 57.7 | 392.1 | 34.8 |
| | High Cu-concentration phase | — | — | 18.4 | — | 13.8 | — | 14.9 | — | 52.9 | | |
| Example 2 | Main phase | — | — | 23.5 | — | 18.2 | — | 0.6 | — | 57.7 | 352.6 | 27.3 |
| | High Cu-concentration phase | — | — | 20.8 | — | 16.1 | — | 6.5 | — | 56.6 | | |
| Example 3 | Main phase | — | — | 23.7 | — | 18.4 | — | 0.7 | 0.8 | 56.4 | 123.2 | 27.1 |
| | High Cu-concentration phase | — | — | 21.7 | — | 16.2 | — | 2.4 | 3.3 | 56.4 | | |
| Example 4 | Main phase | — | — | 23.1 | — | 17.9 | — | 0.6 | 0.9 | 57.5 | 80.2 | 11.9 |
| | High Cu-concentration phase | — | — | 19.6 | — | 15.9 | — | 8.7 | 1.0 | 54.8 | | |
| Example 5 | Main phase | — | — | 23.3 | — | 18.1 | — | 0.5 | — | 58.1 | 62.7 | 9.6 |
| | High Cu-concentration phase | — | — | 16.5 | — | 16.7 | — | 7.9 | — | 58.9 | | |
| Example 6 | Main phase | — | — | 23.0 | — | 18.2 | — | 0.6 | — | 58.2 | 59.8 | 11.7 |
| | High Cu-concentration phase | — | — | 18.3 | — | 19.6 | — | 4.8 | — | 57.3 | | |
| Example 7 | Main phase | — | — | 23.4 | — | 17.8 | — | 0.5 | — | 58.3 | 53.2 | 18.2 |
| | High Cu-concentration phase | — | — | 16.8 | — | 18.9 | — | 6.1 | — | 58.2 | | |
| Example 8 | Main phase | — | — | 23.5 | — | 18.1 | — | 0.6 | — | 57.8 | 40.1 | 31.2 |
| | High Cu-concentration phase | — | — | 19.5 | — | 18.5 | — | 2.3 | — | 59.7 | | |
| Example 9 | Main phase | — | 11.9 | 11.6 | — | 9.5 | 9.2 | 0.6 | — | 57.2 | 256.3 | 18.7 |
| | High Cu-concentration phase | — | 4.9 | 13.7 | — | 7.4 | 7.1 | 8.2 | — | 58.7 | | |
| Example 10 | Main phase | 0.5 | 11.4 | 11.3 | — | 8.9 | 8.7 | 0.6 | — | 58.6 | 95.7 | 21.1 |
| | High Cu-concentration phase | 0.6 | 4.4 | 14.1 | — | 7.9 | 7.4 | 7.7 | — | 57.9 | | |
| Example 11 | Main phase | — | 11.9 | 11.3 | 0.8 | 8.7 | 9.2 | 0.5 | — | 57.6 | 158.5 | 24.2 |
| | High Cu-concentration phase | — | 5.2 | 14.5 | 0.6 | 7.9 | 7.8 | 8.9 | — | 55.1 | | |
| Example 12 | Main phase | — | 11.9 | 11.6 | — | 18.7 | — | 0.6 | — | 57.2 | 127.4 | 13.4 |
| | High Cu-concentration phase | — | 4.7 | 13.9 | — | 14.4 | — | 8.3 | — | 58.7 | | |
| Comparative Example 1 | Main phase | — | — | 24.0 | — | 18.5 | — | 0.6 | — | 56.9 | 139.2 | 48.8 |
| | High Cu-concentration phase | — | — | 19.6 | — | 16.8 | — | 15.9 | — | 47.7 | | |
| Comparative Example 2 | Main phase | — | — | 24.2 | — | 18.1 | — | 0.6 | — | 57.1 | 367.1 | 49.2 |
| | High Cu-concentration phase | — | — | 5.1 | — | 3.3 | — | 53.4 | — | 38.2 | | |
| Comparative Example 3 | Main phase | — | — | 23.6 | — | 17.8 | — | 0.6 | — | 58.0 | 36.4 | 38.2 |
| | High Cu-concentration phase | — | — | 21.3 | — | 19.0 | — | 1.8 | — | 57.9 | | |

From Table 1, when the content ratio of oxygen and the content ratio of copper in the high Cu-concentration phase are within the above-described ranges, it was confirmed that heat generation of the piezoelectric element is suppressed. Note that, numerical values of the content ratios of respective elements shown in Table 1 are semi-quantitative analysis results based on quantitative analysis, and thus the analysis results may include an error caused by effects of analysis conditions, an analysis device, and background and the like.

From FIG. 3, it was confirmed that the sample of Example 5 is constituted by a phase having the perovskite structure.

30 PIEZOELECTRIC LAYER
12 VOLTAGE OUTPUT PART
20e OUTPUT ELECTRODE

The invention claimed is:
1. A piezoelectric composition containing:
at least one or more elements selected from the group consisting of lithium, sodium and potassium;
at least one or more elements selected from the group consisting of vanadium, niobium, and tantalum;
copper or copper and germanium; and
oxygen, wherein the piezoelectric composition has a main phase, and a high Cu-concentration phase in which a content ratio of copper is higher than that in the main phase, the main phase has a perovskite structure, the high Cu-concentration phase has the perovskite structure or a structure similar to the perovskite structure, $O_g$ and $Cu_g$ satisfy relationships of $51 \leq O_g \leq 60$ and $2.0 \leq Cu_g \leq 15$, in which a content ratio of oxygen in the high Cu-concentration phase is set as $O_g$, and a content ratio of copper in the high Cu-concentration phase is set as $Cu_g$, and a CV value of copper in the piezoelectric composition is 40 or more and 300 or less.

2. The piezoelectric composition according to claim 1, wherein lithium, sodium, vanadium, and tantalum are substantially not contained.

3. A piezoelectric element comprising:

the piezoelectric composition according to claim 1; and an electrode.

4. A piezoelectric device comprising:

the piezoelectric element according to claim 3.

5. A piezoelectric transformer comprising:

the piezoelectric element according to claim 3.

6. An ultrasonic motor comprising:

a vibrating body including the piezoelectric element according to claim 3; and a moving body contacting the vibrating body.

7. An ultrasonic wave-generating element comprising:

a vibrating body having a vibrating plate fixed to the piezoelectric element according to claim 3.

8. A filter element comprising:

the piezoelectric element according to claim 3.

* * * * *